US012795946B2

(12) United States Patent
Tsai et al.

(10) Patent No.: US 12,795,946 B2
(45) Date of Patent: Nov. 10, 2026

(54) METHOD FOR FORMING A MEMORY STRUCTURE

(71) Applicant: UNITED MICROELECTRONICS CORP., Hsin-Chu City (TW)

(72) Inventors: Fu-Shou Tsai, Keelung City (TW); Chau-Chung Hou, Kaohsiung City (TW); Yong-Yi Lin, Miaoli County (TW); Yang-Ju Lu, Changhua County (TW); Yu-Lung Shih, Tainan City (TW); Ren-Peng Huang, Tainan City (TW); Ching-Yang Chuang, Pingtung County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 373 days.

(21) Appl. No.: 18/404,839

(22) Filed: Jan. 4, 2024

(65) Prior Publication Data

US 2025/0169079 A1 May 22, 2025

(30) Foreign Application Priority Data

Nov. 16, 2023 (TW) ................................ 112144223

(51) Int. Cl.
*H10B 61/00* (2023.01)

(52) U.S. Cl.
CPC .................................. *H10B 61/00* (2023.02)

(58) Field of Classification Search
None
See application file for complete search history.

(56) References Cited

U.S. PATENT DOCUMENTS

| | | | | |
|---|---|---|---|---|
| 7,001,713 B2 * | 2/2006 | Chen | H10P 95/062 430/311 |
| 2002/0094493 A1 * | 7/2002 | Chen | H10P 95/062 430/311 |
| 2021/0043828 A1 * | 2/2021 | Hong | H10B 63/30 |
| 2022/0158087 A1 * | 5/2022 | Kuo | H10N 50/80 |
| 2022/0238800 A1 * | 7/2022 | Hou | H10N 50/01 |
| 2023/0420264 A1 * | 12/2023 | Chang | H10P 52/403 |

FOREIGN PATENT DOCUMENTS

TW 202115781 4/2021

* cited by examiner

*Primary Examiner* — Nduka E Ojeh
(74) *Attorney, Agent, or Firm* — Winston Hsu

(57) ABSTRACT

A method of forming a semiconductor structure. A memory structure is formed on a substrate in the memory array region. A dielectric layer is deposited over the memory array region and peripheral region to cover the memory structure. A reverse etching process is performed to remove part of the dielectric layer from the central area of the memory array region, thereby forming an upwardly protruding wall structure along perimeter of the memory array region. The remaining thickness of the dielectric layer in the central area is equal to the sum of a polishing buffer thickness and a target thickness. A first polishing process is performed to remove the upwardly protruding wall structure from the memory array region. A second polishing process is performed to remove upper portion of the dielectric layer with the polishing buffer thickness from the memory array region.

15 Claims, 4 Drawing Sheets

METHOD FOR FORMING A MEMORY STRUCTURE

BACKGROUND OF THE INVENTION

1. Field of the Invention

The present invention relates to the field of semiconductor technology, and in particular, to an improved semiconductor structure and a manufacturing method thereof.

2. Description of the Prior Art

Magnetoresistive Random Access Memory (MRAM) is a type of non-volatile random-access memory which stores data in magnetic domains. Data in MRAM is stored by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a magnetic tunnel junction and is the simplest structure for an MRAM bit.

The fabrication process for forming MRAM cells is usually performed at the metallization back-end stage. The subsequently deposited dielectric layer typically forms a step height between the memory array region and the peripheral circuit area. In order to eliminate such a height difference, a reverse etching process is typically performed after depositing the dielectric layer to first remove part of the dielectric layer located in the memory area, and then a chemical mechanical polishing (CMP) process is performed. However, the above-mentioned prior art method will cause scratches on the surface of the dielectric layer, resulting in metal bridge defects when subsequent metal layers are filled in, which reduces the process yield.

SUMMARY OF THE INVENTION

It is one object of the present invention to provide an improved method for forming a semiconductor structure in order to solve the shortcomings or shortcomings of the prior art. One aspect of the invention provides a method for forming a semiconductor structure. A substrate having a memory array region and a peripheral region thereon is provided. A memory structure is formed on the substrate within the memory array region. A step height is formed between the memory array region and the peripheral region. A dielectric layer is blanket deposited over the memory array region and the peripheral region, wherein the dielectric layer covers the memory structure. A reverse etching process is performed to remove a portion of the dielectric layer from a central area of the memory array region, thereby forming an upwardly protruding wall structure along a perimeter of the memory array region. A remaining thickness of the dielectric layer within the central area of the memory array region is equal to a combination of a polishing buffer thickness and a target thickness. The dielectric layer is subjected to a first polishing process to remove the upwardly protruding wall structure from the memory array region. The dielectric layer is subjected to a second polishing process to remove an upper portion of the dielectric layer having the polishing buffer thickness from the memory array region. A remainder of the dielectric layer within the memory array region has the target thickness above the memory structure.

According to some embodiments, the dielectric layer comprises a low-k or ultra-low k dielectric material layer.

According to some embodiments, the dielectric layer has a thickness of 1500 to 2500 angstroms.

According to some embodiments, the remaining thickness of the dielectric layer within the central area of the memory array region is 500-600 angstroms.

According to some embodiments, the remaining thickness of the dielectric layer within the central area of the memory array region is 550 angstroms.

According to some embodiments, the polishing buffer thickness is 250 to 350 angstroms.

According to some embodiments, the target thickness is 200 to 300 angstroms.

According to some embodiments, the memory structure comprises a conductive via embedded in a first intermediate dielectric layer, a memory storage structure embedded in a second intermediate dielectric layer, and a protective layer covering a sidewall of the memory storage structure and the first intermediate dielectric layer.

According to some embodiments, the memory storage structure comprises a magnetic tunneling junction (MTJ) structure situated directly on the conductive via.

According to some embodiments, the conductive via comprises a tungsten via.

According to some embodiments, the first intermediate dielectric layer extends onto the peripheral region.

According to some embodiments, the dielectric layer is in direct contact with the first intermediate dielectric layer within the peripheral region.

According to some embodiments, the dielectric layer has a thickness T and the upwardly protruding wall structure has a height H, and wherein a ratio of the height H to the thickness T is between ½ and ¾.

According to some embodiments, the remaining thickness of the dielectric layer within the central area of the memory array region ranges between ½ and ¼ of the thickness T of the dielectric layer.

According to some embodiments, the remaining thickness of the dielectric layer within the central area of the memory array region is ⅓ of the thickness T of the dielectric layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
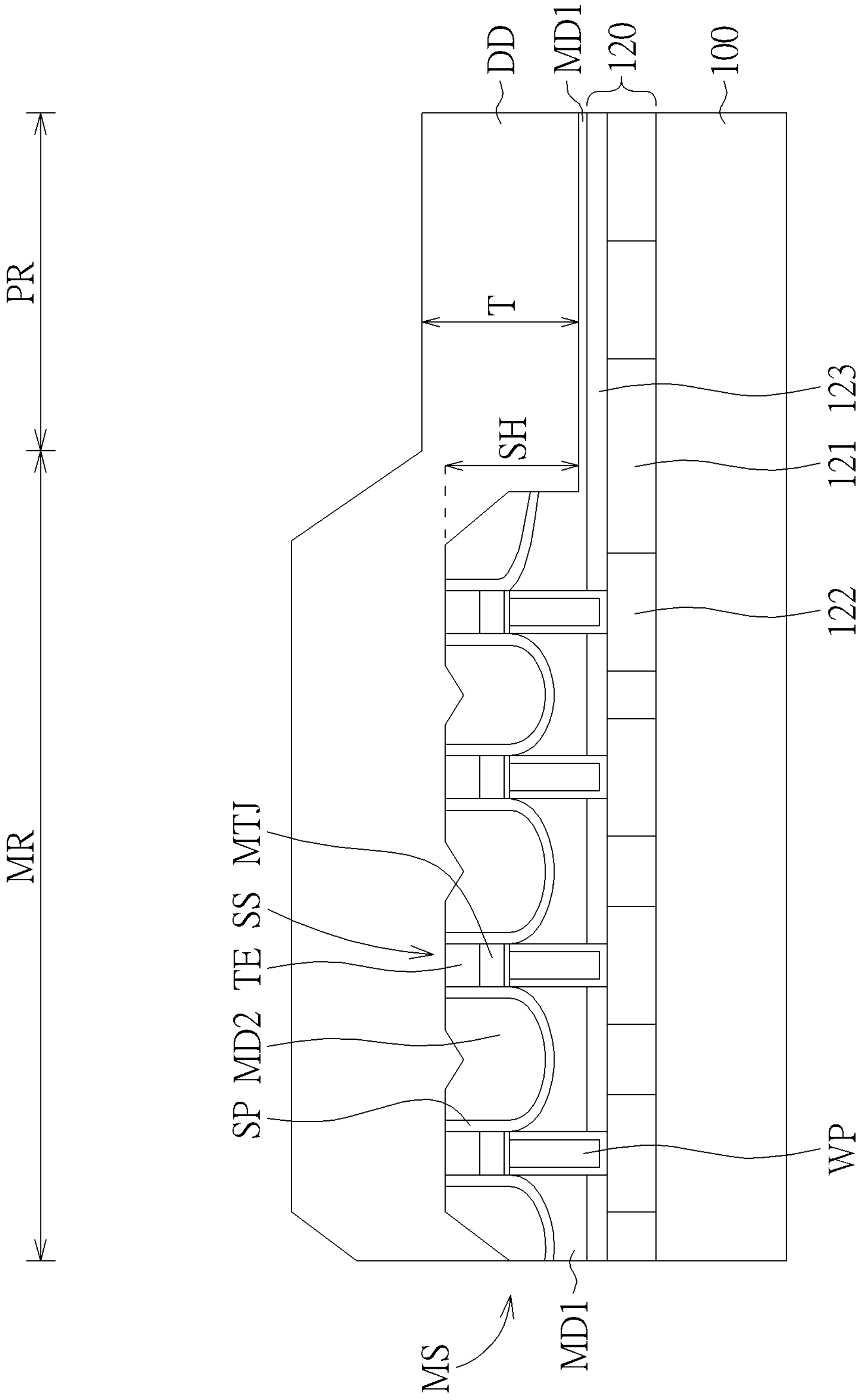
FIG. 1 to FIG. 4 illustrate a method of forming a semiconductor structure in accordance with one embodiment of the present invention.

Please refer to FIG. 1 to FIG. 4, which illustrate a method of forming a semiconductor structure in accordance with one embodiment of the present invention. As shown in FIG. 1, a substrate 100 is provided. For example, the substrate 100 may be a silicon substrate, but is not limited thereto. According to an embodiment of the present invention, the substrate 100 has a memory array region MR and a peripheral region (or peripheral circuit region) PR. According to an embodiment of the present invention, a metal interconnect structure 120 may be formed on the substrate 100. According to an embodiment of the present invention, the metal interconnect structure 120 may include, but is not limited to, an inter-metal dielectric layer 121, a conductive layer 122 embedded in the inter-metal dielectric layer 121, and a capping layer 123 covering the planarized interlayer dielectric layer 121 and the conductive layer 122. According to an embodiment of the present invention, the conductive layer 122 may be, for example, a second metal layer (M2). According to an embodiment of the present invention, the conductive layer 122 may be, for example, a damascened copper metal layer, and the capping layer 123 may be a nitrogen-doped silicon carbide (NDC) layer, but is not limited thereto. Those skilled in the art should understand that the metal interconnect structure 120 can be electrically connected to transistor elements in or on the substrate 100. For the sake of simplicity, the details of these transistor elements are not shown in the figures.

Subsequently, a memory structure MS is formed on the substrate 100 in the memory array region MR. A step height SH is formed between the memory array region MR and the peripheral region PR. For example, SH may be between 1000-1500 angstroms, but not limited thereto. According to an embodiment of the present invention, the memory structure MS includes a conductive via WP embedded in the first intermediate dielectric layer MD1, a memory storage structure SS embedded in the second intermediate dielectric layer MD2, and a protective layer SP covering a sidewall of the memory storage structure SS and the first intermediate dielectric layer MD1. According to an embodiment of the present invention, the first intermediate dielectric layer MD1 may extend onto the peripheral region PR.

According to an embodiment of the present invention, the conductive via WP includes, for example, a tungsten via. According to an embodiment of the present invention, the memory storage structure SS includes a magnetic tunnel junction structure MTJ directly located on the conductive via WP and a top electrode TE directly located on the magnetic tunnel junction structure MTJ.

Subsequently, a dielectric layer DD is deposited over the memory array region MR and the peripheral region PR in a blanket manner. The dielectric layer DD covers the memory structure MS. According to an embodiment of the present invention, for example, the dielectric layer DD may include a low-k dielectric material layer or an ultra-low-k dielectric material layer, but is not limited thereto. According to an embodiment of the present invention, for example, the thickness T of the dielectric layer DD may be 1500-2500 angstroms. According to the embodiment of the present invention, the dielectric layer DD is in direct contact with the first intermediate dielectric layer MD1 in the peripheral region PR.

Figure 2:
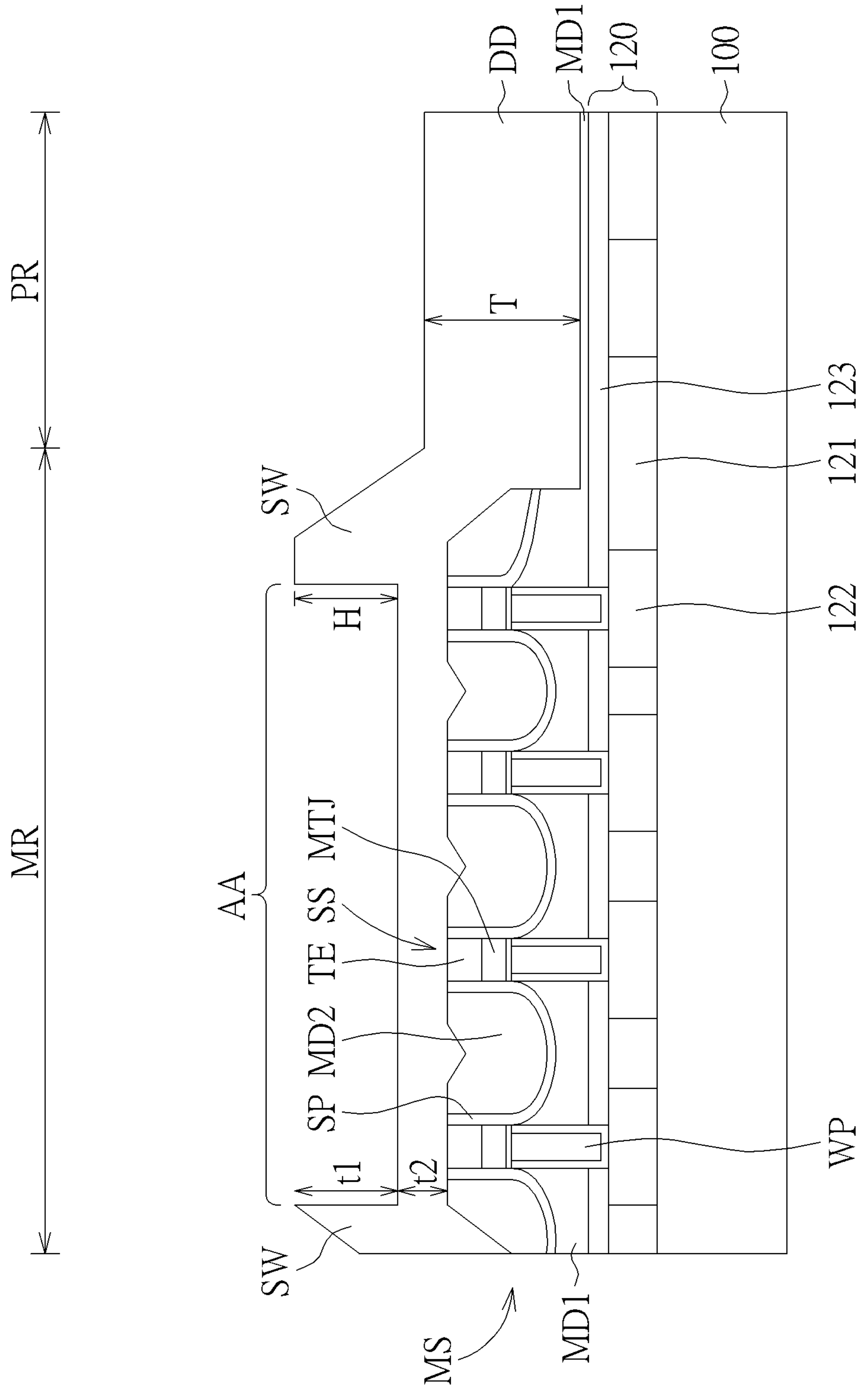

As shown in FIG. 2, a reverse etching process is then performed to remove the dielectric layer DD with thickness t1 from the central area AA of the memory array region MR, thereby forming an upwardly protruding wall structure SW along a perimeter of the memory array region MR. The remaining thickness t2 of the dielectric layer DD in the central area AA is equal to a combination of a polishing buffer thickness and a target thickness.

According to an embodiment of the present invention, for example, t1 is approximately 1000-1900 angstroms. According to an embodiment of the present invention, for example, t2 is about 500-600 angstroms. According to an embodiment of the present invention, for example, t2 is about 550 angstroms. According to an embodiment of the present invention, the above-mentioned polishing buffer thickness is about 250-350 angstroms. According to an embodiment of the present invention, the above-mentioned target thickness is about 200-300 angstroms.

According to an embodiment of the present invention, the dielectric layer DD has a thickness T, and the upwardly protruding wall structure SW has a height H, then H/T is between ½-¾. According to an embodiment of the present invention, the remaining thickness t2 of the dielectric layer DD in the central area AA of the memory array region MR may be between T/2 and T/4. According to an embodiment of the present invention, for example, the remaining thickness t2 of the dielectric layer DD in the central area AA of the memory array region MR may be T/3.

Figure 3:
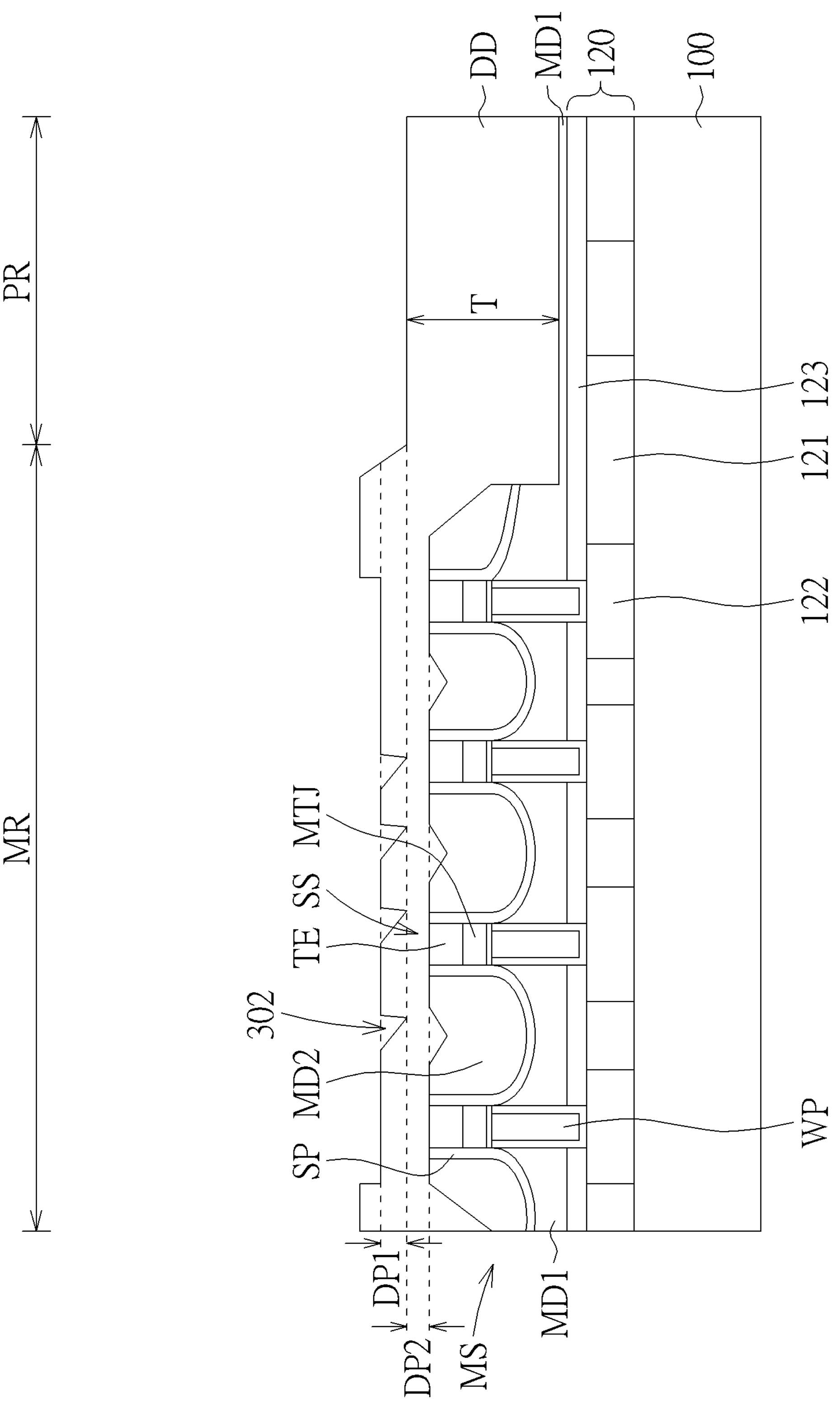

As shown in FIG. 3, a first polishing process is performed on the dielectric layer DD to remove the upwardly protruding wall structure SW from the memory array region MR. According to embodiments of the present invention, the first polishing process may be a chemical mechanical polishing process. At this point, scratches 302 may be formed on the surface of the dielectric layer DD. The dielectric layer DD within the memory array region MR may include an upper portion DP1 and a lower portion DP2. The scratches 302 may be formed on or in the upper portion DP1. The upper portion DP1 has a thickness approximately equal to the polishing buffer thickness.

Figure 4:
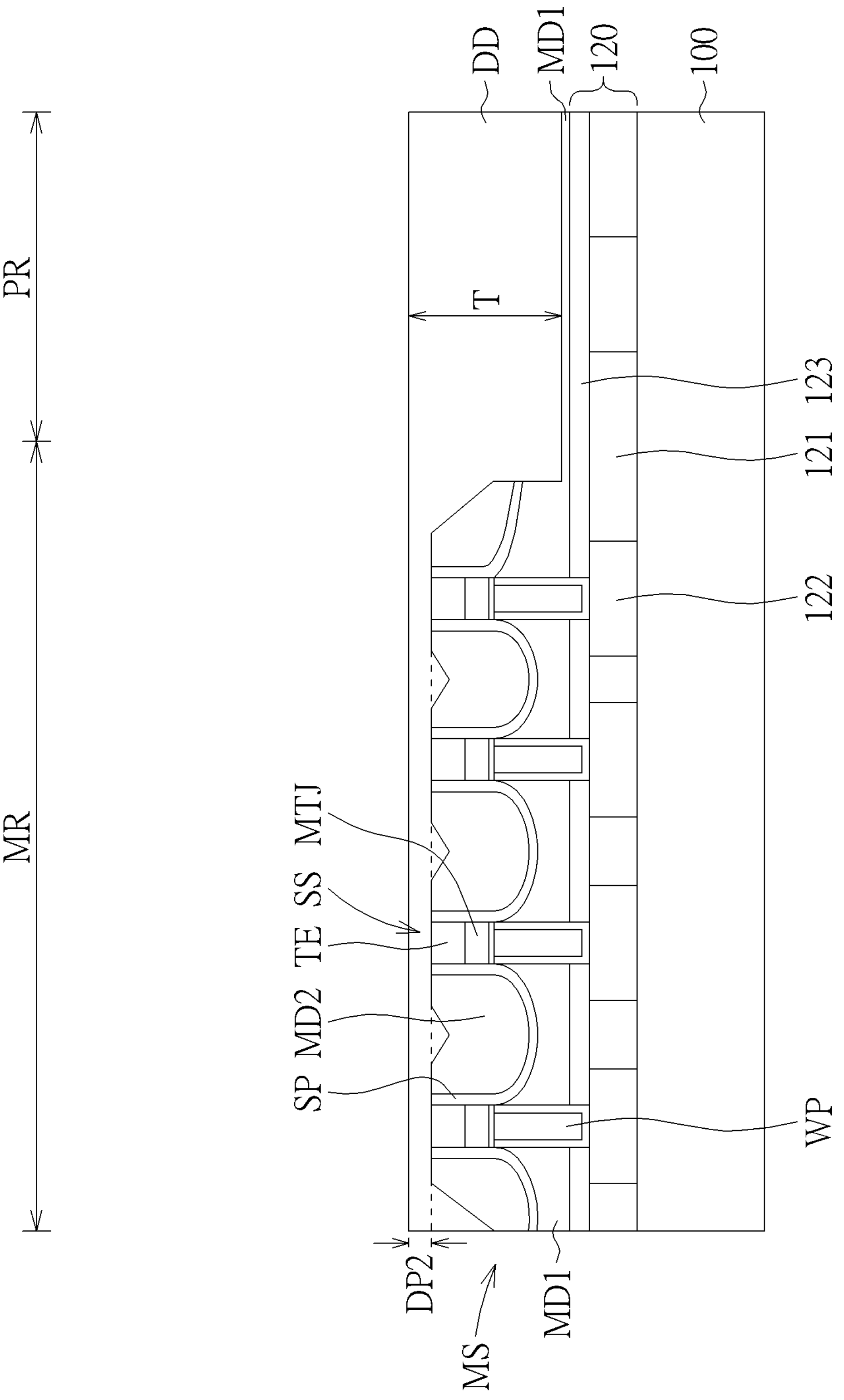

As shown in FIG. 4, the second polishing process is then performed on the dielectric layer DD, and the upper portion DP1 of the dielectric layer DD is removed from the memory array region MR. At this point, the thickness of the remaining lower portion DP2 of the dielectric layer DD in the memory array region MR above the memory structure MS is approximately equal to the target thickness. According to an embodiment of the present invention, after the second polishing process is completed, the upper surface of the dielectric layer DD in the memory array region MR and the upper surface of the dielectric layer DD in the peripheral region PR are coplanar. Subsequently, the next layer, for example, the third metal layer (M3) of the metal interconnect structure can be formed. Since the metal interconnection process is a well-known technique, the details thereof are omitted.

It is advantageous to use the present invention method because during the reverse etching process, the etching depth of the dielectric layer DD is reduced to retain the polishing buffer thickness. When performing the first polishing process, scratches can be formed on the buffer upper portion DP1 of the dielectric layer DD, and then the upper portion DP1 of the dielectric layer DD is removed in the subsequent second polishing process, which can effectively avoid metal bridging and improve the process yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, comprising:

providing a substrate having a memory array region and a peripheral region thereon;

forming a memory structure on the substrate within the memory array region, wherein a step height is formed between the memory array region and the peripheral region;

blanketly depositing a dielectric layer over the memory array region and the peripheral region, wherein the dielectric layer covers the memory structure;

performing a reverse etching process to remove a portion of the dielectric layer from a central area of the memory array region, thereby forming an upwardly protruding wall structure along a perimeter of the memory array region, wherein a remaining thickness of the dielectric layer within the central area of the memory array region is equal to a combination of a polishing buffer thickness and a target thickness;

subjecting the dielectric layer to a first polishing process to remove the upwardly protruding wall structure from the memory array region; and subjecting the dielectric layer to a second polishing process to remove an upper portion of the dielectric layer having the polishing buffer thickness from the memory array region, wherein a remainder of the dielectric layer within the memory array region has the target thickness above the memory structure.

2. The method according to claim 1, wherein the dielectric layer comprises a low-k or ultra-low k dielectric material layer.

3. The method according to claim 1, wherein the dielectric layer has a thickness of 1500 to 2500 angstroms.

4. The method according to claim 3, wherein the remaining thickness of the dielectric layer within the central area of the memory array region is 500-600 angstroms.

5. The method according to claim 3, wherein the remaining thickness of the dielectric layer within the central area of the memory array region is 550 angstroms.

6. The method according to claim 5, wherein the polishing buffer thickness is 250 to 350 angstroms.

7. The method according to claim 6, wherein the target thickness is 200 to 300 angstroms.

8. The method according to claim 1, wherein the memory structure comprises a conductive via embedded in a first intermediate dielectric layer, a memory storage structure embedded in a second intermediate dielectric layer, and a protective layer covering a sidewall of the memory storage structure and the first intermediate dielectric layer.

9. The method according to claim 8, wherein the memory storage structure comprises a magnetic tunneling junction (MTJ) structure situated directly on the conductive via.

10. The method according to claim 8, wherein the conductive via comprises a tungsten via.

11. The method according to claim 8, wherein the first intermediate dielectric layer extends onto the peripheral region.

12. The method according to claim 11, wherein the dielectric layer is in direct contact with the first intermediate dielectric layer within the peripheral region.

13. The method according to claim 1, wherein the dielectric layer has a thickness T and the upwardly protruding wall structure has a height H, and wherein a ratio of the height H to the thickness T is between ½ and ¾.

14. The method according to claim 13, wherein the remaining thickness of the dielectric layer within the central area of the memory array region ranges between ½ and ¼ of the thickness T of the dielectric layer.

15. The method according to claim 13, wherein the remaining thickness of the dielectric layer within the central area of the memory array region is ⅓ of the thickness T of the dielectric layer.

* * * * *